United States Patent
Zheng et al.

(10) Patent No.: US 10,755,375 B2
(45) Date of Patent: Aug. 25, 2020

(54) SYSTEMS AND METHODS FOR STEGANOGRAPHY BASED ON TEXT FONTS

(71) Applicant: The Trustees of Columbia University in the City of New York, New York, NY (US)

(72) Inventors: Changxi Zheng, New York, NY (US); Chang Xiao, New York, NY (US); Cheng Zhang, New York, NY (US)

(*) Notice: Subject to any disclaimer, the term of this patent is extended or adjusted under 35 U.S.C. 154(b) by 0 days.

(21) Appl. No.: 15/903,888

(22) Filed: Feb. 23, 2018

(65) Prior Publication Data
US 2018/0247386 A1    Aug. 30, 2018

Related U.S. Application Data

(60) Provisional application No. 62/463,118, filed on Feb. 24, 2017.

(51) Int. Cl.
*G06K 9/68* (2006.01)
*G06T 1/00* (2006.01)
(Continued)

(52) U.S. Cl.
CPC .......... *G06T 1/0021* (2013.01); *G06K 9/6828* (2013.01); *G06T 1/0028* (2013.01);
(Continued)

(58) Field of Classification Search
CPC .............. G06T 1/0021; G06T 1/0028; G06T 2201/0062; G06T 2201/0061; H03M 13/159; H03M 13/09; G06K 9/6828
(Continued)

(56) References Cited

U.S. PATENT DOCUMENTS 5,805,173 A * 9/1998 Glennon ............... G06T 1/0007
345/501
6,614,914 B1 * 9/2003 Rhoads ................ G06K 7/1417
382/100
(Continued)

FOREIGN PATENT DOCUMENTS

KR       20160028717 A    3/2016
WO         07035062 A1    3/2007
(Continued)

OTHER PUBLICATIONS

Wesam Bhaya et al., "Text Steganography Based on Font Type in MS-Word Documents" journal of computer science 9(7)-898-904, 2013.*
(Continued)

*Primary Examiner* — Sheela C Chawan
(74) *Attorney, Agent, or Firm* — Occhiuti & Rohlicek LLP

(57) ABSTRACT

Disclosed are methods, systems, devices, apparatus, media, and other implementations, including a method that includes obtaining input visual data comprising a sequence of symbols, selected from a symbol set, with each of the symbols associated with a glyph representation. The method also includes obtaining a code message comprising code message symbols, and modifying at least one of the symbols of the input visual data to a different glyph representation associated with a respective at least one of the code message symbols to generate, at a first time instance, a resultant coded visual data.

16 Claims, 7 Drawing Sheets

(51) Int. Cl.
*H03M 13/15* (2006.01)
*H03M 13/09* (2006.01)

(52) U.S. Cl.
CPC ... *H03M 13/159* (2013.01); *G06T 2201/0061* (2013.01); *G06T 2201/0062* (2013.01); *H03M 13/09* (2013.01)

(58) Field of Classification Search
USPC ............... 382/100, 229, 181, 224, 226, 154; 235/487, 494, 435, 439, 454, 456; 713/150, 168, 176
See application file for complete search history.

(56) References Cited

U.S. PATENT DOCUMENTS

| | | | |
|---|---|---|---|
| 7,526,812 | B2 | 4/2009 | DeYoung |
| 8,194,274 | B2 | 6/2012 | Babbrah et al. |
| 9,069,971 | B2 * | 6/2015 | Barbu ...................... G06F 7/723 |
| 9,509,882 | B2 | 11/2016 | Reed et al. |
| 2016/0203382 | A1 * | 7/2016 | Gardiner .............. G06K 9/4633 382/190 |
| 2016/0350269 | A1 | 12/2016 | Nakashima |

FOREIGN PATENT DOCUMENTS

| | | |
|---|---|---|
| WO | 09144796 A1 | 12/2009 |
| WO | 10131939 A1 | 11/2010 |

OTHER PUBLICATIONS

Alattar, A. M., & Alattar, O. M. (Jun. 2004). Watermarking electronic text documents containing justified paragraphs and irregular line spacing. In Security, Steganography, and Watermarking of Multimedia Contents VI, (5306) 685-695. International Society for Optics and Photonics. DOI:10.1117/12.527147.

Clark, A. J. (Jul. 2007). Document metadata, tracking and tracing. Network Security, 4-7. https://doi.org/10.1016/S1353-4858(07)70062-4.

Erbacher, R. F., Daniels, J., & Montiero, S. (May 2009). OleDetection Forensics and Anti-forensics of Steganography in OLE2-Formatted Documents. In 2009 Fourth International IEEE Workshop on Systematic Approaches to Digital Forensic Engineering , 85-96. IEEE.

Khairullah, M. (2014). A novel text steganography system in financial statements. International Journal of Database Theory and Application, 7(5), 123-132. http://dx.doi.org/10.14257/ijdta.2014.7.5.09.

Kim, Y. W., Moon, K. A., & Oh, I. S. (Aug. 2003). A Text Watermarking Algorithm based on Word Classification and Interword Space Statistics. In Proceedings of the Seventh International Conference on Document Analysis and Recognition (ICDAR), 775-779.

Konc, J., & Janezic, D. (2007). An improved branch and bound algorithm for the maximum clique problem. proteins, 4(5).

Panda, J., Gupta, N., Saxena, P., Agrawal, S., Jain, S., & Bhattacharyya, A. (2015). Text watermarking using sinusoidal greyscale variations of font based on alphabet count. International Journal of Innovative Research in Computer and Communication Engineering, 3(4), 3353-3361.

Rivest, R. (Apr. 1992). The MD5 Message-Digest Algorith. Network Working Group, 1-21. Retrieved from https://dl.acm.org/doi/pdf/10.17487/RFC1321 on Jan. 16, 2020.

Rosen, K. H. (2011). Elementary number theory. Pearson Education. Retrieved from https://www.math.upenn.edu/~kazdan/210S19/Notes/crypto/z/Rosen-Number-Th-Solns-6ed.pdf on Jan. 16, 2020.

Stojanov, I., Mileva, A., & Stojanovic, I. (2014). A New Property Coding in Text Steganography of Microsoft Word Documents. SECURWARE 2014, 36.

Bradski, G. (2000). The OpenCV Lubrary. Dr Dobb's J. Software Tools, 25, 120-125. Retrieved from https://www.drdobbs.com/article/print?articleId=184404319&siteSectionName=open-source on Jan. 14, 2020.

Ruggles, L. (1983). Letterform design systems. Department of Computer Science, Stanford University.

Shamir, A., & Rappoport, A. (Mar. 1998). Feature-based design of fonts using constraints. In International Conference on Raster Imaging and Digital Typography, 93-108. Springer, Berlin, Heidelberg.

Zheng, C. (Feb. 1, 2015). CAREER: Simulating Nonlinear Audiovisual Dynamics for Simulated Environments and Interactive Applications. NSF Grant No. 1453101, Award Abstract (Continuing grant).

Manager's introduction to adobe extensible metadata platform. The Adobe XML Metadata Framework. 2001.

Adobe. (n.d.). Adobe XMP Developer Center. Retrieved from https://www.adobe.com/devnet/xmp.html on Dec. 23, 2019.

Adobe. (n.d.). Extensible Metadata Platform (XMP). Retrieved from https://www.adobe.com/products/xmp.html on Dec. 23, 2019.

Agarwal M. 2013. Text steganographic approaches: a comparison. International Journal of Network Security & Its Applications (IJNSA) 5, 1.

Al-Asadi, S. A., & Bhaya, W. (2016). Text steganography in excel documents using color and type of fonts. Res J Appl Sci, 11(10), 1054-1059.

Bhaya W. rahma A.M. and dhamyaa A.N. 2013. Text steganography based on font type in ms-word documents. Journal of computer Science 9, 7, 898.

Bloom, J.A. et al. 1999. Copy protection for dvd video. Proceedings of IEEE 87, 7, 1267-1276.

Boneh, D. 2000. Finding smooth integers in short intervals using crt decoding. In Proceedings of the 32nd ACM symposium on Theorty of computing 265-272.

Bradski G. 2000. The OpenCV Library. Dr. Dobb's Journal of Software Tools.

Brassil J.T. et al. 1995. Electroinic marking and identification techniques to discourage document copying. IEEE Journal on Selected Areas in Communications 13, 8, 1495-1504.

Campbell N. and Kautz J. 2014. Learning a manifold of fonts. ACM Trans. Graph. 33:4 (July) 91:1-91:11.

Castiglione, A., De Santis, A., & Soriente, C. (May 2007). Taking advantages of a disadvantage: Digital forensics and steganography using document metadata. Journal of Systems and Software, 80(5), 750-764.

Chaudhary S. et al. 2016. Text steganography based on feature coding method. In Proceedings of the International Conference on Advances in Information Communication Technology & Computing ACM 7.

Changzi., Z. (Feb. 1, 2015). CAREER: Simulating Nonlinear Audiovisual Dynamics for Simulated Environments and Interactive Applications. NSF Grant No. 1453101, Award Abstract (Continuing grant).

Eastlake D. and Jones P., 2001. Us secure hash algo-rithm 1 (sha1).

Denso A. 2011. Qr code essentials. Denso Wave 900.

Dogan, G. et al. 2015. Fft-based alignment of 2d closed curves with application to elastic shape analysis. In Proceedings of 1st International Workshop on Differential Geometry in Computer Vision for Analysis of Shape, Images and Trajectories 4222-4230.

Garfinkel, S. L. (Nov. 4, 2013). Leaking Sensitive Information in Complex Document Files—and How to Prevent It. IEEE Security & Privacy, 12(1), 20-27.

Goldreich O. et al. 1999. Chinese remaindering with errors. In Proceedings of the 31st ACM symposium on Theory of computing; 225-234.

Gutub A. and Fatani M. 2007. A novel Arabic text steganography method using letter points and extensions. World Academy of Science, Engineering and Technology 27; 28-31.

Hu, C., and Hersch R. D. 2001. Parameterizable fonts based on shape components. IEEE Computer Graphics and Applications 21; 3 70-85.

Greenberg J. 2005. Understanding metadata and metadata schemes. Cataloging & classi?cation quarterly 40; 3-4 17-36.

(56) References Cited

OTHER PUBLICATIONS

Kabsch W. 1978. A discussion of the solution for the best rotation to relate two sets of vectors. Acta Crystallographica Section A: Crystal Physics Diffraction Theoretical and General Crystallography 34 5 827-828.

Kahn D. 1996. The history of steganography. In International Workshop on Information Hiding; Springer 1-5.

Karp R. M. 1972. Reducibility among combinatorial problems. In Complexity of computer computations. Springer; 85-103.

Loviscach J. 2010. The universe of fonts, charted by machine. In ACM SIGGRAPH 2010 Talks; ACM 27.

Mahato, S., Yadav, D. K., & Khan, D. A. (2014). A Novel Approach to Text Steganography Using Font Size of Invisible Space Characters in Microsoft Word Document. In Intelligent Computing, Networking, and Informatics, 1047-1054 Springer, New Delhi.

Muller M. et al. 2005. Meshless deformations based on shape matching. ACM Transactions on Graphics (TOG) 24 3 471-478.

O'Deegan, N. (2014). "The advantages of preserving document descriptive metadata directly in the document file," ProQuest Dissertations, 1-51.

O'Donovan P. et al. 2014. Exploratory font selection using crowdsourced attributes. ACM Trans. Graph. 33: 4 (July), 92:1-92:9.

Reed, I.S. and Solomon G. 1960. Polynomial codes over certain finite fields. J. Society for industrial and applied mathematics; 8: 2; 300-304.

Rivers A.R. and James D.L. 2007. Fastlsm: fast lattice shape matching for robust real-time deformation. ACM Transactions of Graphics (TOG) 26; 3; 82.

Rivest R.L. et al. 1978. A method for obtaining digital signatures and public key cryptosystems. Communications of the ACM 21:2; 120-126.

Rizzo S. G. et al. 2016. Content-preserving text watermarking through unicode homoglyph substitution. In Proceedings of the 20th International Database Engineering & Applications Symposium; ACM 97-104.

Ruggles, L. 1983. Letterform design systems. Tech. rep. Stanford University.

Shamir A. and Rappoport A. 1998. Feature-based design of fonts using constraints. In Electronic Publishing, Artistic Imag ing, and Digital Typography. Springer, 93-108.

Shannon, C.E. 1948. A mathematical theory of communication. The Bell System Technical Journal 27; 379-423, 623-656.

Smith R. 2007. An overview of the tesseract ocr engine. In Proceedings of the Ninth Intl. Conf. on Document Analysis and Recognition—vol. 02. IEEE Computer Society; ISDAR 2007 629-633.

Suveeranont R. and Igarashi T. 2010. Example-based automatic font generation. In International Symposium on Smart Graphics; Springer 127-138.

Wayner P. 1992 Mimic functions. Cryptologia 16; 3 793-214.

Wayner P. 2009. Disappearing cryptography: information hiding: steganography & watermarking. Morgan Kaufmann.

\* cited by examiner

500

| Bit stream | 010111 | 1011010 | 1000 | 1001001 |
| Integer sequence | 23 | 186 | 8 | 73 |
| Letter seq. | Bilbo | was ve | ry ric | h and very... |

SYSTEMS AND METHODS FOR STEGANOGRAPHY BASED ON TEXT FONTS

CROSS-REFERENCE TO RELATED APPLICATIONS

This application claims priority to, and the benefit of, U.S. Provisional Application No. 62/463,118, entitled "STEGANOGRAPHY ON TEXT FONT" and filed Feb. 24, 2017, the content of which is incorporated herein by reference in its entirety.

STATEMENT REGARDING FEDERALLY SPONSORED RESEARCH

This invention was made with government support under 1453101 awarded by National Science Foundation. The Government has certain rights in the invention.

BACKGROUND

Steganography, the process of concealing secret messages in other plain messages, can be used to encode secret data, and protect digital assets (e.g., against data piracy). In the digital era, steganographic techniques have been applied to digital image, video, and audio data. However, use of digital text steganography is generally considered more challenging than its counterparts for image, video, and audio data. This is because the "pixel" of a text document is its individual letters, which, unlike an image pixel, cannot be changed into other letters without causing noticeable differences.

SUMMARY

In some variations, a method is provided that includes obtaining input visual data comprising a sequence of symbols, selected from a symbol set, with each of the symbols associated with a glyph representation. The method also includes obtaining a code message comprising code message symbols, and modifying at least one of the symbols of the input visual data to a different glyph representation associated with a respective at least one of the code message symbols to generate, at a first time instance, a resultant coded visual data.

Embodiments of the method may include at least some of the features described in the present disclosure, including one or more of the following features.

Modifying the at least one of the symbols may include modifying the at least one of the symbols with the different glyph representation associated with the respective at least one of the code message symbols according to a codebook comprising, for each available symbol from the symbol set, a corresponding set of glyphs associated with respective ones of available code message symbols.

The method may further include determining a font associated with the sequence of symbols, and selecting the codebook from a plurality of codebooks based on the determined font.

The codebook may define a set of error correcting codes. The set of error correcting codes may include codes based on the Chinese Reminder Theorem (CRT).

The method may further include communicating, at a second time instance subsequent to the first time instance, the generated resultant coded visual data to a remote device. The communicated generated resultant coded visual data may be decoded at the remote device according to a decoding process that includes computing, for each of the modified at least one of the symbols with the different glyph representation, distance metrics between the at least one of the symbols with the different glyph representation and each glyph in the corresponding set of glyphs in the codebook, and determining, based on the computed distance metrics, the respective code message symbol corresponding to the each of modified at least one of the symbols with the different glyph representation.

The decoding process at the remote device may further include extracting from the communicated generated resultant coded visual data the each of the modified at least one of the symbols with the different glyph representation, and aligning the extracted each of the modified at least one of the symbols with the different glyph representation with symbols in the codebook, the aligning being based on outlines of the extracted each of the modified at least one of the symbols and of the symbols in the codebook.

Determining, based on the computed distance metrics, the code message symbol may include selecting a decoded glyph associated with a minimum distance metrics between the each of modified at least one of the symbols and possible decoded glyph candidates for the each of modified at least one of the symbols.

The code message may include a sequence of integers representative of a plain text message encoded into the sequence of integers.

In some variations, a system is provided that includes at least one processor, and storage media comprising computer instructions that, when executed on the at least one processor, cause operations including obtaining input visual data comprising a sequence of symbols, selected from a symbol set, with each of the symbols associated with a glyph representation. The operations further include obtaining a code message comprising code message symbols, and modifying at least one of the symbols of the input visual data to a different glyph representation associated with a respective at least one of the code message symbols to generate, at a first time instance, a resultant coded visual data.

In some variations, a non-transitory computer readable media is provided that includes computer instructions, executable on a processor-based device, to obtain input visual data comprising a sequence of symbols, selected from a symbol set, with each of the symbols associated with a glyph representation. The computer readable media includes additional computer instructions to obtain a code message comprising code message symbols, and modify at least one of the symbols of the input visual data to a different glyph representation associated with a respective at least one of the code message symbols to generate, at a first time instance, a resultant coded visual data.

Embodiments of the system and the computer readable media may include at least some of the features described in the present disclosure, including at least some of the features described above in relation to the method.

Other features and advantages of the invention are apparent from the following description, and from the claims.

BRIEF DESCRIPTION OF THE DRAWINGS

These and other aspects will now be described in detail with reference to the following drawings.

Like reference symbols in the various drawings indicate like elements.

DESCRIPTION

Figure 1:
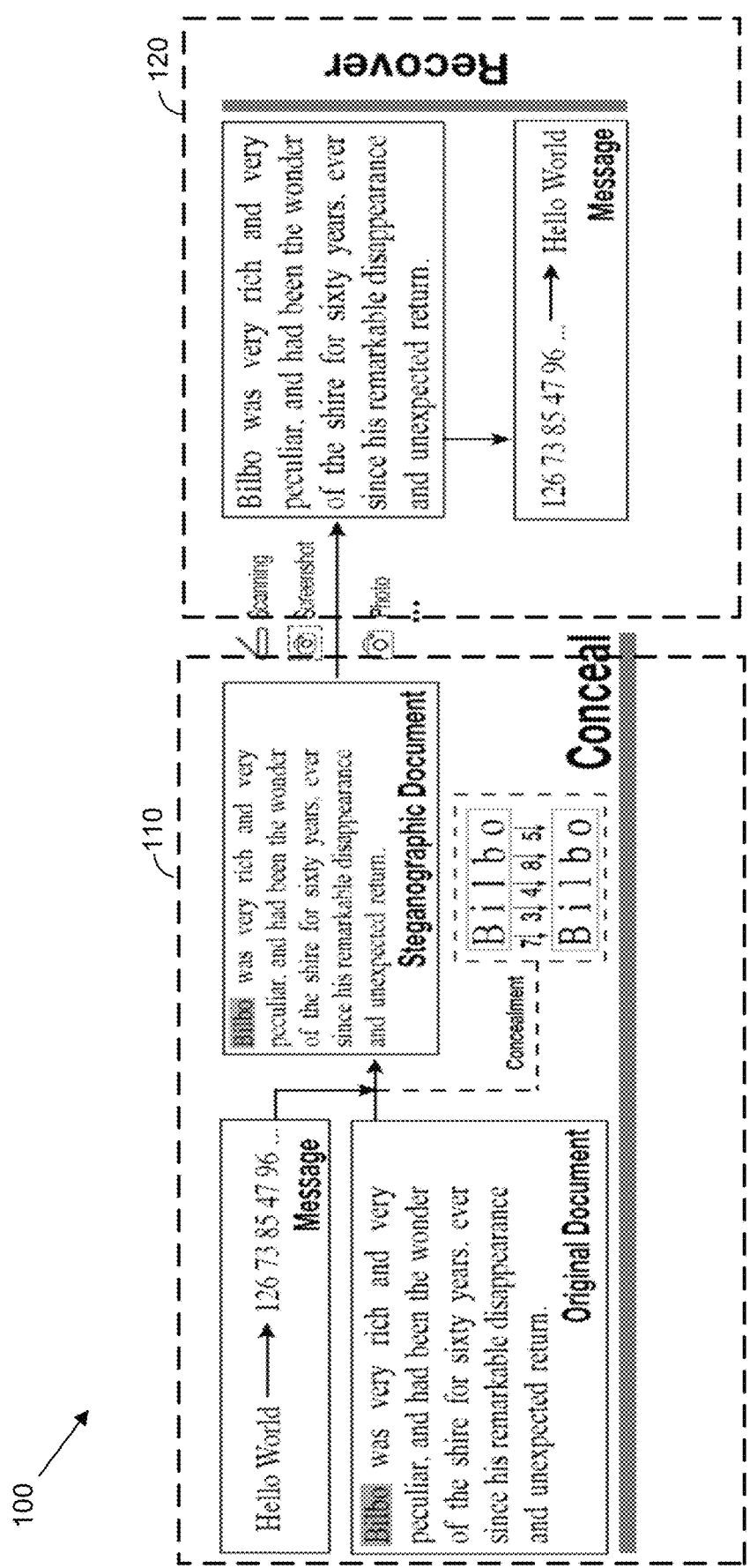
FIG. 1 is a diagram illustrating an overview of an example process to encode information using glyphs.

Described herein are systems, devices, apparatus, methods, computer program products, media, and other implementations to conceal/code an arbitrary information in a text document. Given a text document with specific fonts, the implementations described herein are configured to code (conceal) arbitrary, user-specified information in the text by perturbing the glyphs of visual symbols (e.g., text characters). The glyph perturbations are generally made imperceptible to the human eye, but still recognizable through computer processing. As a result, the coded/hidden information is substantially retained regardless of the text document file format, whether it is provided in a vector graphic file (e.g., PDFs) or pixel-based image (e.g., JPG files). Even if the text document is converted into different format or printed on paper, the hidden information is still preserved.

The implementations described herein (including the "FontCode" implementation that was realized and tested to evaluate the procedures described herein) are configured to conceal the user-provided information in the text-based document and generate a steganographic document that looks substantially similar to the original document. Implementations for glyph recognition to extract the coded/hidden information from a steganographic document stored as a vector graphic or pixel image, or on a printed paper, are provided. To this end, a novel error-correction coding scheme configured to rectify a certain number of recognition errors, as more particularly described below is provided.

The glyph-based steganographic implementations described herein may be used in various applications. For example, the steganographic implementations described herein allow the incorporation of metadata into resultant text documents (to which the glyph-based steganographic procedures have been applied), in a manner akin to metadata stored in photos. The use of glyph-based steganographic processing for metadata storage is format independent, with the metadata preserved even when the text document is converted into a different digital file format or is printed on paper. Glyph-based steganographic processing can also be used to provide human imperceptible, but machine readable, optical codes, that can replace optical barcodes (such as QR codes) to avoid visual distraction. Additionally, in some embodiments, the glyph-based steganographic techniques/implementations described herein offer a basic cryptographic scheme that not only conceals but also encrypts information. In some embodiments, the glyph-based steganographic implementations also provide a new text signature mechanism that allows the verification of document authentication and integrity, regardless of its digital format or physical form.

Thus, the implementations described herein provide various functionalities (e.g., secured encoding of data, authentication through digital ID's, storage of metadata, implementation of optical codes such as QR codes) in a single framework. Furthermore, unlike some technologies in which authentication and metadata features can be circumvented (defeated) through conversion of the data from one format to another (e.g., tampering with data to eliminate/remove signatures and metadata by converting a PDF file into an SVG file), the signature and metadata capabilities of the glyph-based steganographic implementations provided herein cannot be circumvented through conversion of the data from one format to another. Moreover, tampering detection in the embodiments described herein may also allow determining where in the data the tampering is occurring. Additionally, in comparison with QR codes, the glyph-based steganographic implementations described herein are unobtrusive, and do not result in visible patterns (such as the black-and-white patterns) presented on a surface, and as such the optical codes (analogous to the QR-codes) embedded into the document do not cause visually distracting artifacts.

Advantages of the glyph-based steganographic implementations described herein include: 1) concealment of arbitrary information in a text document without substantially altering the text content or appearance, 2) allowing, in some embodiments, error correction when hidden information is subsequently retrieved (i.e., even if there are recognition errors occurring at the decoding stage, the errors can be rectified), and/or 3) the concealed information is retained when the text document is converted into different file format or printed on paper.

The text steganography implementations described herein are configured, in some embodiments, to conceal in a text document any type of information as a bit string. For example, an arbitrary text message can be coded into a bit string using the standard ASCII code or Unicode. Such a bit string may be referred to as a plain message or a code message. Given a text document, the basic elements of carrying a hidden message are its letters, displayed with a particular font. The implementations described herein perturb the glyph of each letter to hide/code the plain message. To this end, the concept of font manifold is used. Taking as input a collection of existing font files, a low-dimensional font manifold can be created for every character (e.g., alphanumerical characters) such that every location on this manifold generates a particular glyph of that character. This novel generative model may be precomputed once for each character. Then, it allows altering the glyph of each text letter in a subtle yet systematic way, to thus conceal messages.

With reference to FIG. 1, a diagram illustrating an overview of a process 100 to encode information using glyphs is shown. The process includes a concealment stage 110 in which visual input (e.g., a sequence of characters presented in some font, or is otherwise presented with some visual characteristics) is obtained (e.g., as an image captured through an image acquisition device, as a document retrieved from local memory or via a remote location through a wired or wireless link, etc.) The concealment stage 110 also include obtaining an input message that is to be encoded, and modifying the symbols of the visual inputs into different glyph representations associated with the respective symbols of the message to be coded. Thus, in the example of FIG. 1, the device implementing the process (e.g., a computing device with various input acquisition functionalities) receives input information to be coded and a text-based document (a different type of document or input data with visual characteristics may be used instead). The device encodes the input information, in the example of FIG. 1, into a series of integers and divides the letter of the of the source document (carrier source) into blocks. The integers are then assigned to each block and concealed in individual letters (characters). At a recovery stage 120, the modified carrier source (e.g., the modified text outputted by the device that performed the concealment stage 110) is obtained (e.g., via source acquisition modules, such as a light-capture device, a scanner, an RF or optical receiver, etc.), and integers (or whatever other type of code was encoded into the carrier source) are extracted from the individual letters by determining/recognizing their glyphs. The recovered integers can then be decoded into a plain message.

More particularly, message concealment may include two main stages: (i) precomputation of a codebook for processing all documents, and (ii) runtime concealment of a plain message in a given document. During the precomputation stage, a codebook of perturbed glyphs for typically used fonts is constructed. Consider a particular font such as Times New Roman. Every character in this font corresponds to a specific location, $\bar{u}$, on its font manifold. A set of locations on the manifold is identified as the perturbed glyphs of $\bar{u}$ and denoted as $\{u_0, u_1, \ldots\}$. The goal at this stage is to select the perturbed glyphs such that their differences from the glyph of the original font $\bar{u}$ is substantially unnoticeable to the naked eye, but recognizable through computer processing. The sets of perturbed glyphs for all characters with typically used fonts form the steganography codebook.

At runtime, input visual data, such as a text document (e.g., a text region or paragraph) is provided, and the glyphs of at least some of the letters (symbols) in the document are perturbed to conceal a given plain message. For example, consider a letter with an original font $\bar{u}$ in the given document. Suppose that in the precomputed codebook, this letter has N perturbed glyphs, such that $\{u_0, u_1, \ldots, u_{N-1}\}$. An integer i in the range of [0,N) can then be concealed (coded) by changing the glyph from $\bar{u}$ to $u_i$. An additional procedural component in this stage is to determine the concealed integers for all letters such that together they encode the plain message. In some embodiments, and as will be described in greater detail below, an error correction coding scheme may be implemented to cipher the plain message. This coding scheme adds certain redundancy (i.e., some extra data) to the coded message, which, at the decoding time, can be used to check for consistency of the coded message and recover it from errors.

Subsequently, at some later time (following the coding of the concealed message into the input visual data), the concealed message may be recovered from the coded text document (the steganographic document). Particularly, in a first operation, an integer (or some other symbol) is recovered from each symbol (e.g., a letter) of the modified input visual data. Given a letter from the steganographic document, its glyph u' is recognized. Suppose that in the codebook, this letter has N perturbed glyphs, whose manifold locations are $\{u_0, u_1, \ldots, u_{N-1}\}$. Among them, a glyph $u_i$ is identified that is closest to u' under a glyph distance metric, and the integer i is then extracted (or otherwise recovered) from that letter. The recognition procedure works with not only vector graphics documents (such as those stored as PDFs) but also rasterized documents stored as pixel images. As noted, in some embodiments, the retrieved integers may then be fed into an implemented error correction coding scheme to reconstruct the plain message. Because of the data redundancy introduced by the error correction coding scheme, even if some glyphs are mistakenly recognized (e.g., due to poor image rasterization quality), those errors can be rectified, and it can still be possible to recover the message correctly.

Figure 2:
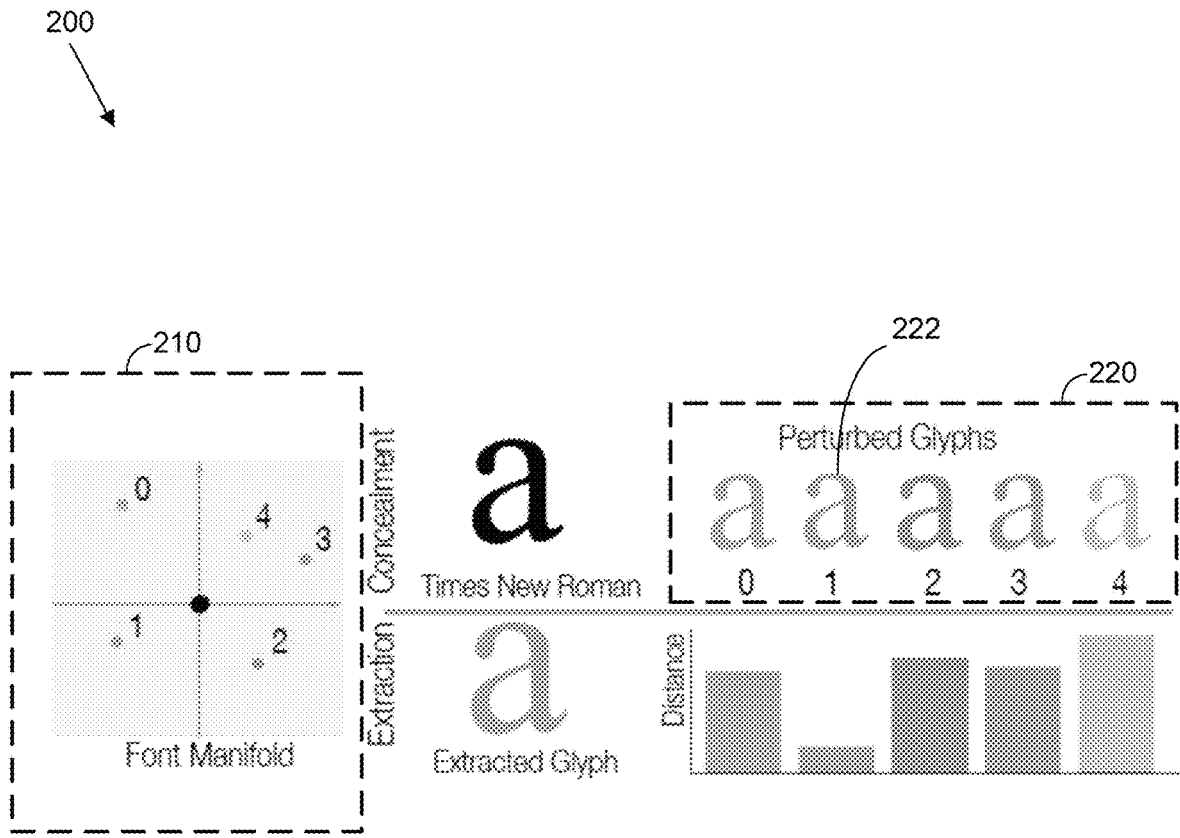
FIG. 2 is a diagram illustrating aspects of concealment and extraction processes.

With reference to FIG. 2, an example diagram 200 illustrating concealment and extraction process is shown. The diagram includes a font manifold 210, in which 5 points are sampled, resulting in five (5) different perturbed glyphs (shown in an area 220 of the diagram 200) that are used to conceal integers (different codes may be used for concealment). For example, the number "1" is concealed in the letter a by using the second glyph 222 in the perturbation list. In the extraction stage, distance metrics are computed between input glyph contours and individual perturbed glyphs. In the example of FIG. 2, the extracted integer is the one whose glyph resulted in the lowest distance value.

As noted, a goal of the implementations described herein is to conceal a code (such as an integer number) in a character (a single letter) of a carrier source (e.g., an underlying document with multiple characters), and later retrieve that code (integer) from a vector graphics or pixel image of that character. The implementations described herein therefore include a determination of what codes (e.g., integers) to assign to letters in order to encode a message. Concealment is done through glyph perturbation by looking up a precomputed codebook. Later, when extracting an integer from a letter (referred to as a steganographic letter), a "distance" is computed between the extracted glyph and each perturbed glyph in $\{u_0, \ldots, u_{N-1}\}$ in the codebook. The integer i is identified, in some embodiments, if the distance to the glyph $u_i$ is the minimum distance. In both the codebook precomputation and the integer extraction, the measure of distance between two glyphs is relied upon.

One way to measure distance between two glyphs is based on their respective outlines in polylines. Consider a situation in which a first glyph may be generated according to a location on a font manifold comprising one or more closed contours, each represented by a polyline of vertices. A second glyph is extracted from an input image (which may be a vector graphic or pixel image). Assume that the second glyph is represented as polylines that have denser vertices than the first glyph, one that is generated from the font manifold model. The first glyph is denoted using u, corresponding to a point on the font manifold, and the second glyph is denoted as f. The goal is to define d(u,f) that measures the distance between u and f. Extracted from an input image, glyph f may be stretched and rotated due to a perspective camera projection. Moreover, the vertex correspondence between f and u is unclear. A distance measure is therefore sought that is robust to these variations, and is fast to evaluate. The performance of such a distance measure is important because that distance measure (or function) will be evaluated many times when the concealed message needs to be recovered at runtime. Algorithm 1, provided below, is an example two-step procedure to compute glyph distance between d(u,f).

| Algorithm 1: Compute glyph distance d(u, f) |  |
|---|---|
| 1 | Initialization: T ← Optimal rigid transformation to align f to u; |
| 2 | Apply T to f; |
| 3 | u ← ScaleAndTranslate(u); |
| 4 | $d_p$ ← ∞; |
| 5 | while true do |
| 6 |    f' ← ScaleAndTranslate(f); |
| 7 |    $f_{sub}$ ← FindClosestPoint(f') (with a k-d tree); |
| 8 |    d ← $\|f_{sub} - u\|_2$; |
| 9 |    if d > $0.999 d_p$ then |
| 10 |      break |
| 11 |    end |
| 12 |    $d_p$ ← d; |
| 13 |    R ← ShapeMatch($f_{sub}$, u); |
| 14 |    f ← $R_f$, |
| 15 | end |

A first step in the glyph distance computation procedure is initialization, aiming to rigidly transform f to align with u as closely as possible. The contours are thus first normalized for both f and u such that each of their outlines has a unit total length. f is also translated to align its centroid with that of u. The outlines of the glyphs are then aligned. Among various ways of doing so, in some embodiments, the procedure suggested in Dogan et al. ("Fft-based alignment of 2d closed curves with application to elastic shape Analysis," Proceedings of the 1st International Workshop on Differential Geometry in Computer Vision for Analysis of Shape, Images and Trajectories, 4222-4230, the content of which is hereby incorporated by reference in its entirety) is adopted thanks to its low computational cost. The Dogan method uniformly resamples along the closed contour of f such that it has the same number of vertices as u. The vertex number is denoted as N. The method then finds the optimal starting point and rotation off to align with u. By setting a vertex in f as the starting vertex to correspond with vertices in u, an optimal rotation can be computed in O(N) time. By iterating through each vertex in f as the starting vertex and computing the rotation, one can find the best correspondence and rotation. A naïve implementation of this process results in an $O(N^2)$ complexity. The procedure of Dogan leverages the Fast Fourier Transform (FFT), reducing the complexity down to $O(N \log N)$.

Figure 3:
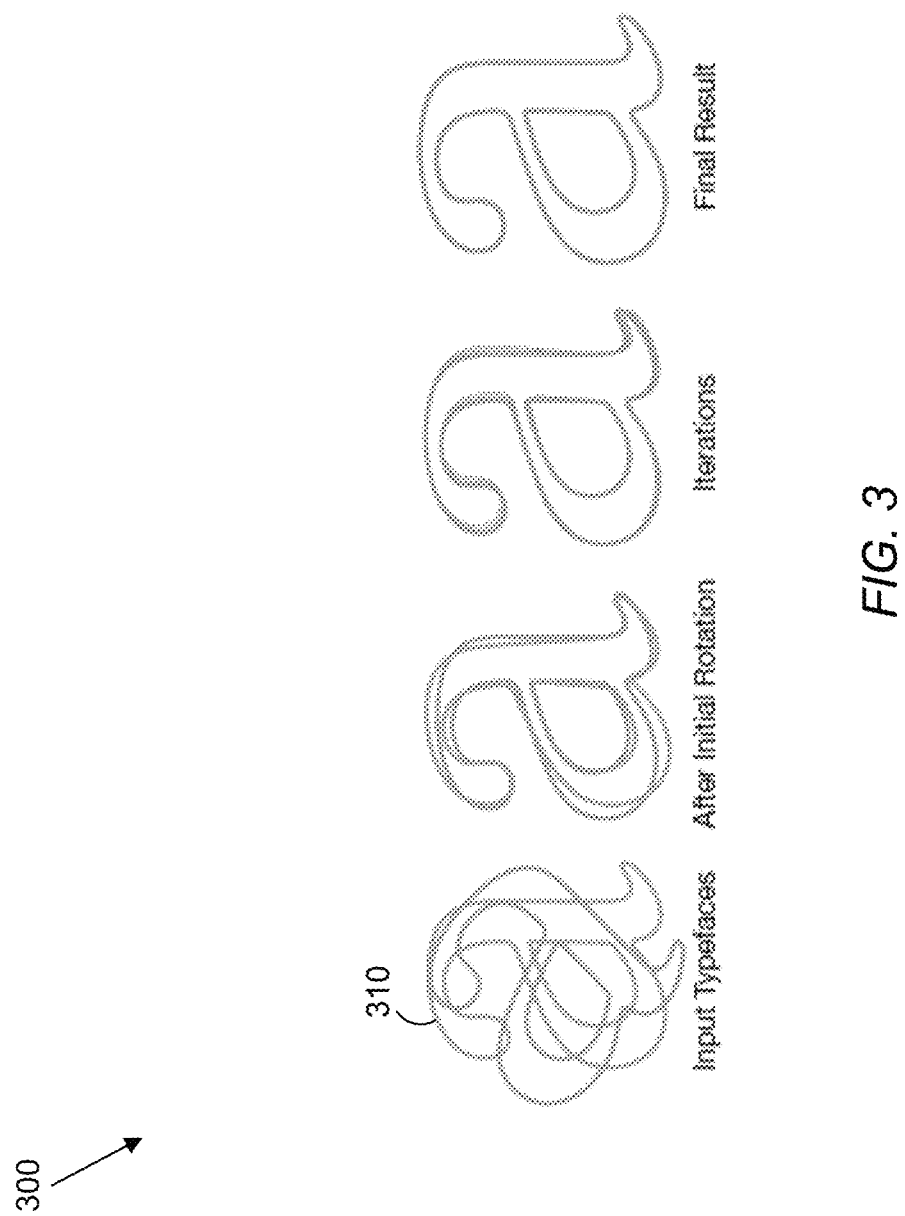
FIG. 3 includes a diagram of an example glyph alignment process.

At the end of this step, a 2D rigid transformation, T, is obtained that best aligns f with u. This is illustrated in FIG. 3 which shows a diagram 300 of an example glyph alignment process. In FIG. 3, the contours of glyph f (the slanted letter "a" 310) are being aligned with the glyph u. In this example, f may have been extracted from an input image and u may have been generated from the font manifold. The initial rigid transformation cannot align them well, because f is perspectively distorted. Iterative non-rigid transformations improve the alignment.

In a first attempt, a vertex-based $L_2$ distance between u and the transformed version of f, T(f), is computed as the typeface distance. Unfortunately, this measure is not reliable: the extracted glyph f from the image of that letter may be distorted or non-uniformly scaled, due to the camera perspective projection. In various experiments, the distortion can enlarge the distance measure, leading to an incorrect glyph recognition.

In a second step of a procedure to compute a glyph distance, the effects of glyph distortion are sought to be reduced, similar to an Iterative Closest Point process. Let $V_u$ denote all vertices of u and $V_f$ denote all vertices of f. The vertices $V_f$ are transformed using T. Then, in an iterative process, $V_f$ and $V_u$ are scaled to normalize their bounding box sizes. It is to be noted that this scale is non-rigid; it scales along x- and y-direction differently. The vertices are then translated in $V_f$ by the vector $t=p_0-q_0$, where:

$$p_0 = \frac{1}{N_u}\sum_{i=1}^{N_u} p_i \text{ and } q_0 = \frac{1}{N_f}\sum_{j=1}^{N_f} q_j$$

Here, $p_i$ iterates through 2D positions of vertices in $V_u$, and $q_j$ indicate positions of vertices in $V_f$. Next, for every vertex $p_i \in V_u$, its correspondence in $V_f$ is estimated by finding a vertex $\tilde{q}_i \in V_f$ that is closest to $p_i$. With these corresponding vertices, a least-squares rotation R is determined that aligns $\tilde{q}_i$ to $p_i$ as closely as possible. In some embodiment, the Kabsch procedure ("Discussion of the solution for the best rotation to relate two sets of vectors," Acta Crystallographica Section 1159 A: Crystal Physics, Diffraction, Theoretical and General Crystallography 34, 5, 827-828, the content of which is hereby incorporated by reference) may be used. Thus, R is computed as the rotational part of the 2×2 matrix $$A=\sum_{i=1}^{N_u}(\tilde{q}_i-q_0)(p_i-p_0)^T,$$

using the polar decomposition A=RU. R is then applied to all vertices in $V_f$, the $L_2$ distance between all $p_i$ and $\tilde{q}_i$ is evaluated, and the next iteration is performed. This iterative process stops when the distance change from last iteration is smaller than a reference value (threshold). The glyph distance d(u,f) is set to be the final distance value at the end of the iterations.

In the above described two-stage procedure, the first step helps to correct rigid rotation in f and the second step helps to alleviate the detriment of non-uniform scales.

As part of the encoding/decoding implementations described herein, a glyph codebook needs to be constructed, which may be a lookup table that includes set of perturbed glyphs for every character with commonly used fonts (such as Times New Roman, Helvetica, and Calibri). The construction aims to satisfy two criteria: (i) the included glyph perturbations must be perceptually similar; their differences from the original fonts should be hardly noticeable, and (ii) the distance measure should be able to distinguish the perturbed glyphs reliably, even in the presence of camera distortions, different lighting conditions, and image rasterizations.

To illustrate the codebook construction procedure, consider a single character with a given original font, with a location u' on the character's font manifold. In a nutshell, the construction procedure first finds a large set of glyph candidates that are perceptually similar to u'. It then discards the candidates that may confuse the distance measure in recognition tests. In some embodiments, user studies may be conducted to identify a region on the font manifold, in which all glyphs are perceptually similar to u'. This process may follow a methodology such as the one discussed in O'Donovan et al. ("Exploratory font selection using crowd-sourced attributes," ACM Trans. Graph. 33, 4 (July), 92:1-92:9, the content of which is hereby incorporated by reference in its entirety) of using crowdsourced studies on Mechanical Turk (MTurk). Based on user studies, a function s(u;u') can be determined that measures the perceptual similarity between the glyph of a manifold location u and the original font u'. It is noted that this metric differs from the glyph distance discussed above, which is configured to distinguish glyphs that are already selected as being perceptually similar. Thus, two perceptually similar glyphs might have a large typeface distance.

To set up the user studies, a large region centered at u' is first chosen on the font manifold, and locations densely in this region are sampled. In practice, all font manifolds are in 2D, and locations are sampled uniformly in a squared region centered at u'. Let F denote the set of glyphs corresponding to the sampled manifold locations. Then, in each MTurk task, the MTurk worker is presented with a pair of glyphs randomly selected from F, and is asked which glyph looks closer to the glyph of the original font u'. Lastly, on the font manifold, a contour region satisfying s(u;u')>τ is identified, where r is a user-specified value to control the similarity of perturbed glyphs from the original fonts u' (an example value used in some the experimentations and testing conducted for the implementation described herein is τ=85). All the pre-sampled glyphs in F are iterated through, and those inside of the contour region are added into a set C, forming the set of perceptually similar glyphs.

Next, among the perceptually similar glyphs, those distinguishable by the glyphs distance metric are selected, and stored in the codebook as the set of perturbed glyphs. The purpose of this selection is to ensure that the perturbed glyphs used for message concealment can be recognized reliably in the retrieval process. To understand the recognition reliability, suppose that a letter with a font u' has perturbed glyphs $\{u_0, \ldots, u_{N-1}\}$ in the codebook, and that the letter's glyph is changed into $u_i$ to conceal the integer i. At the retrieval time, when an image (pixel or vector graphics) of this letter is provided, its glyph outlines f are first determined, and the distance $d(u_j,f)$ is computed for all $j=0 \ldots N-1$. To extract the integer i correctly, $d(u_i,f)$ needs to yield the minimum distance. Unfortunately, this is not always true, because the input steganographic document can be an image captured by camera, for which factors such as the lighting condition, camera perspective, and image resolution may all distort the outline extraction and thus enlarge $d(u_i,f)$. As a result, the glyph outline f may be mistakenly decoded into a different integer.

In experimentations and testing performed for the implementations described herein, the image capture process is mimicked using a physically based image renderer, taking into account lighting and camera variations. Using synthetic images, a check of how easily two glyphs can get confused under different imaging conditions can be made. These tests allow the formulation of a graph problem to finally identify perturbed glyphs that are distinguishable from each other.

In some embodiments, a confusion test may be used to eliminate/preclude certain glyphs from the set C of the perceptually similar glyphs. Particularly, every glyph in C may be checked in an iterative process. Throughout, every glyph i in C is associated with a list $L_i$ of glyphs that can be reliably distinguished from i. Initially, $L_i$ includes all glyphs except i itself (i.e., $L_i=C-\{i\}$). In each iteration, a texture comprising all glyphs in C is generated using the generative model. The texture is fed to a physically based renderer to simulate the image capture process. In the renderer, a point light position and intensity (in RGB channels respectively) is randomly assigned. Because the image resolution affects the glyph outline extraction (higher resolution leads to more accurate glyph outlines and hence less distortion), for the rendered image the height of each glyph is conservatively set to have the lowest resolution (e.g., 75px) allowed in a capturing process in practice.

Next, confusions are evaluated. From the rendered image, the outlines of all glyphs, denoted as $f_j$, $j=0 \ldots |C|-1$, are extracted. Meanwhile, their "true" glyphs used for generating the image are known, and are denoted as $\tilde{u}_j$, $j=0 \ldots |C|-1$. Each glyph $\tilde{u}_j$ has a distinguishable glyph list $L_j$. Then, for every $\tilde{u}_j$, the distance $d(\tilde{u}_j, f_j)$ between the detected glyph outlines and its true glyph is computed. The distance $d(\tilde{u}_j, f_j)$ is compared with the distances between $f_j$ and all glyphs in $L_j$. If there exists any k in $L_j$ such that $d(\tilde{u}_k,f_j)<\beta d(\tilde{u}_j,f_j)$, then it is likely that $f_j$ would be mistakenly recognized. Therefore, k is removed from $L_j$. Here $\beta$ is a relaxation coefficient, requiring $f_j$ clearly closer to $\tilde{u}_j$ than any other glyphs.

In each iteration, the confusion test may be performed for every glyph in C, and their distinguishable lists $L_i$ keeps shrinking. The iteration is stopped until none of the lists has changed for five iterations.

Figure 4:
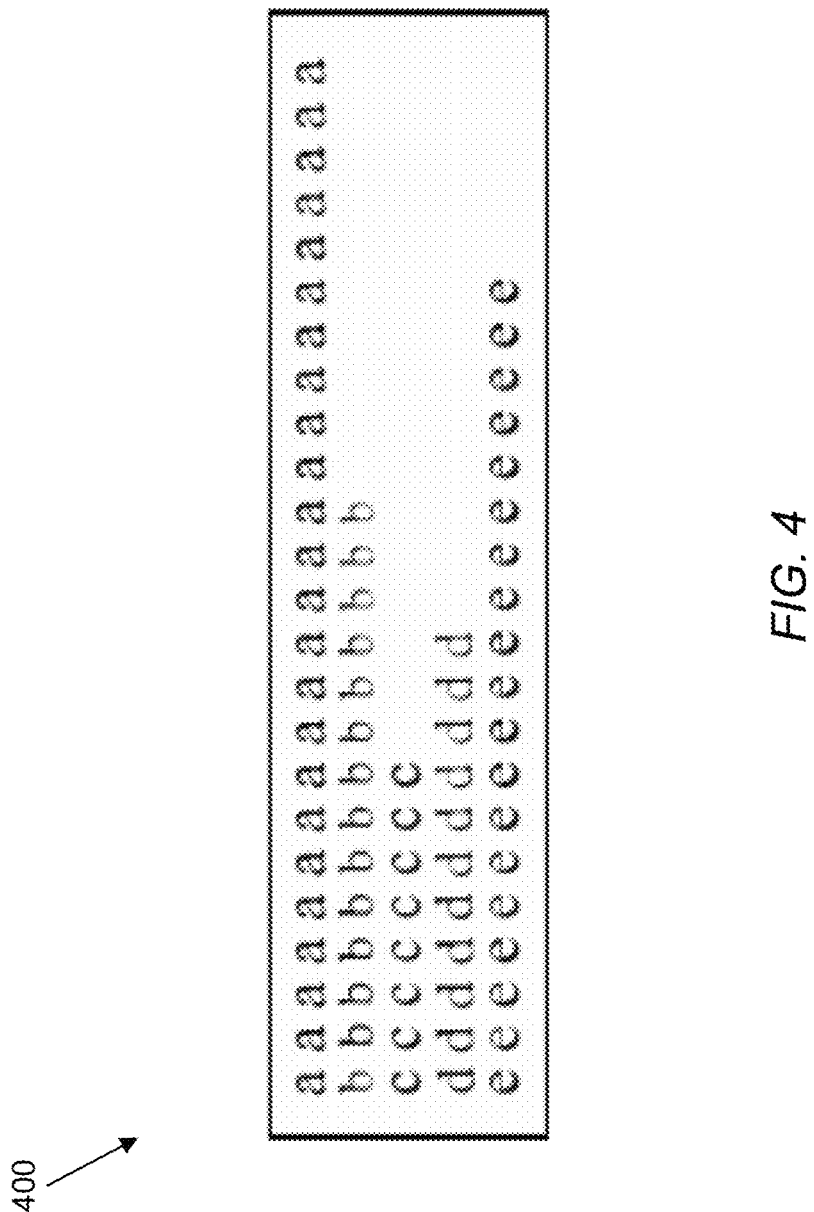
FIG. 4 includes a diagram of a portion of a codebook for alphabetic characters for a Times New Roman font.

In some embodiments, after the distinguishable glyph lists are established, the set of perturbed glyphs is selected by constructing a graph. On the graph, every node i represents a glyph in C that is perceptually similar to the original font u'. An edge between nodes i and j is established, if the glyph j is in the list $L_i$ and the glyph i is in the list of $L_j$, meaning that i and j can be distinguished by the distance metric. With this graph, the maximum set of glyphs that can be distinguished from each other can be determined. This amounts to the classic maximum clique problem of a graph. Although the maximum clique problem has been proven NP-hard, graph size for the implementations described herein is small (with about 300 nodes), and the edges are sparse. Consequently, many existing algorithms suffice to find the maximum clique efficiently. For example, in some embodiment, the method of Konc and Janezic ("An improved branch and bound algorithm for the maximum clique problem"; proteins 4, 5, the content of which is hereby incorporated by reference in its entirety) may be used. Lastly, the glyphs corresponding to the maximum clique nodes are stored in the codebook as the perturbed glyphs of u'. FIG. 4 is a diagram of a portion of a codebook 400 for alphabetic characters for a Times New Roman font.

Having determined a codebook of glyphs, message coding and retrieval can be implemented. At a coding device, a code message, represented using, for example, integers, may be concealed into a text document. Input to a processing device implementing the concealment process may include a text document (e.g., provided in either vector graphics or pixel image format) from which the text content and the layout of the letters can be extracted at a decoding device (which may be the same or different from the coding device). The process also needs to know the original font u' of the text. This can be specified by the user, or detected automatically from the metadata (e.g., of a PDF document) or through some other detection process. If the provided text document is a pixel image, its letters may be recognized using an optical character recognition (OCR) library (e.g., Tesseract, which is a popular open source OCR engine). In addition to the detected letters, OCR may also output a bounding box on the pixel image for each letter.

In order to encode an integer i in a letter with the font u', its perturbed glyph list $\{u_0, \ldots, u_{N-1}\}$ is looked-up in the precomputed codebook, and the letter outline with the glyph $u_i$ is generated. The generated perturbed glyph can then be scaled along its horizontal and vertical directions to fit it into the bounding box of the letter, and to replace the letter in the input document with the scaled glyph. Note that the horizontal and vertical scales might be different, but the distance metric used may account for non-uniform scales. Thus, it causes no problem in the decoding step.

To retrieve integers, the glyph outlines of every letter in the input steganographic document are first extracted. This step is straightforward for vector graphics document, where letters are described explicitly by outline contours. For rasterized documents such as those printed or imaged, an OCR engine may be used to detect all letters and their bounding boxes. Given a detected letter, its bounding box region is cropped, and the cropped region is upsampled into a high-resolution image (e.g., 1000px in height), which can then binarized into a black-and-white image (e.g., using Otsu's thresholding method offered in OpenCV). It is noted that here the binarization threshold may be adapted to individual bounding box regions, so it is robust to the lighting variation across the image. Afterwards, an edge detection is applied to obtain closed polylines of glyph boundaries. Because the image is upsampled, the detected boundary polylines have dense vertex samples. In practice, at least some of the image processing operations may be implemented using methods provided by OpenCV.

Each detected letter may be processed in parallel. For each letter with a detected glyph outline f, its original font u' is recognized by finding the minimum distance of d(u'$_k$,f), where u'k iterates through the glyphs of standard fonts (such as Times New Roman, Helvetica, etc.) without perturbation. Here the rationale is that even though f is an extracted outline of a perturbed glyph whose original font is u', the distance to its original font remains much smaller than the distance to a different font, because the perturbed glyphs by construction are perceptually similar to the original font. This step can be skipped if it is known a priori what kind of font u' is being used. Lastly, the retrieval process iterates through the perturbed glyphs {u$_0$, . . . , u$_{N-1}$} in the codebook for the letter with the detected font u', and decode an integer i if the distance d(u$_i$,f) is the minimum for all i=0 . . . N−1.

Having described the concealment and retrieval of integer values over individual letters, the coding schemes that may be used to represent bit strings as a series of integers, which in turn can be concealed into visual characters, will next be considered. The coding scheme also introduces an error correction decoding process that decodes the bit string from a series of integers, even when some integers are incorrect. Common error-correction coding scheme include block coding, in which an information sequence is divided into blocks of k symbols each. Consider a block using a k-tuple, r=(r$_1$, r$_2$, . . . , r$_k$). For example, a 128-bit binary string can be divided into 16 blocks of 8-bit binary strings. In this case, k=8, and r$_i$ is either 0 or 1. In general, r$_i$ can vary in other ranges of values. A fundamental requirement of error-correction coding is that (i) the number of possible symbols for each r$_i$ must be the same, and (ii) this number must be a prime power p$^m$, where p is a prime number and m is a positive integer. In abstract algebraic language, it requires the blocks in a Galois Field, GF(p$^m$). For example, the aforementioned 8-bit strings are in GF(2). Most of the current error-correction coding schemes (e.g., Reed-Solomon codes) are built on the algebraic operations in the polynomial ring of GF(p$^m$). At encoding time, they transform k-tuple blocks into n-tuple blocks in the same Galois field GF(p$^m$), where n is larger than k. At decoding time, some symbols in the n-tuple blocks can be incorrect. As long as the total number of incorrect symbols in a block is no more than $$\left\lfloor \frac{n-k}{2} \right\rfloor,$$

regardless of the locations of the incorrections, the coding scheme can fully recover the original k-tuple block.

In the current problem, the given text document consists of a sequence of letters. At first glance, the letter sequence can be divided into blocks of k letters each. Unfortunately, these blocks are ill-suited for traditional block coding schemes. For example, consider a five-letter block, (C$_1$, C$_2$, . . . , C$_5$), with an original font u'. Every letter has a different capacity for concealing an integer: in the codebook, C$_i$ has s$_i$ glyphs, so it can conceal integers in the range [0, s$_i$). However, in order to use block coding, we need to find a prime power p$^m$ that is no more than any s$_i$, i=1 . . . 5 (to construct a Galois field GF(p$^m$)). Then every letter can only conceal p$^m$ integers, which can be significantly smaller than s$_i$. An improved approach is to find t$_i$=⌊log 2 s$_i$⌋ for every and use the 5-letter block to represent a T-bit binary string, where T=Σ$_{i=1}^5$t$_i$. In this case, this binary string is in GF(2), valid for blocking coding. Still, this approach wastes much of the letters' concealment capacity. For example, if a letter has 30 perturbed glyphs, in this approach it can only conceal integers in [0, 15]. As experimentally shown, it significantly reduces the amount of information that can be concealed. In addition, traditional block coding method is often concerned with a noise communication channel, where an error occurs at individual bits. In contract, here recognition error occurs at individual letters. When the glyph of a letter is mistakenly recognized, a chunk of bits may become incorrect, and the number of incorrect bits depends on specific letters. As a result, it is harder to set a proper relative redundancy (i.e., (n−k)/n in block coding) to guarantee successful error correction.

To address these challenges, a new coding scheme is introduced based on a 1700-year old number theorem, the Chinese remainder theorem (CRT). Error-correction coding based on Chinese remainder theorem has been studied in the field of theoretical computing, known as the Chinese Remainder Codes (CRC). Building on CRC, a coding scheme is proposed offering improved error-correction ability.

The problem definition is as follows. Given a text document, we divide its letter sequence into blocks of n letters each. Consider a block, denoted as C=(C$_1$, C$_2$, . . . , C$_n$), with an original font u', the goal for now is to conceal an integer m in this n-letter block, where m is in the range [0,M). The plain message is mapped into a series of integers m. Formally, an encoding function is sought, denoted as φ: m→r, where r=(r$_1$, . . . , r$_n$) is an n-vector of integers. Following the coding theory convention, r is referred to as a codeword. The function φ needs to ensure that every r$_i$ can be concealed in the letter C$_i$. Meanwhile, a decoding function is defined as φ$^+$: r→m. This requires φ to be injective, so r can be uniquely mapped to m. In addition, the computation of φ and φ$^+$ must be fast in order to encode and decode in a timely fashion.

With the notation and problem defined, the concept of Hamming Distance decoding is introduced, which is a general decoding framework for block codes, to pave the background for the coding schemes described herein. Given two codewords u and v, the Hamming Distance H(u, v) measures the number of pair-wise elements in which they differ. For example, given two codewords, u=(2, 3, 1, 0, 6) and v=(2, 0, 1, 0, 7), H(u, v)=2.

Consider now glyph recognition errors. If a provided glyph contour is heavily distorted, the integer retrieval from that glyph may be incorrect. As a result, the input r˜ of the decoding function φ+ may not be a valid codeword. In other words, because of the recognition errors, it is possible that no m satisfies φ(m)=r˜. To distinguish from a codeword, r˜ is referred to as a code vector. The Hamming distance decoding uses a decoding function φ$^+$ based on the Hamming distance: φ$^+$(r˜) returns an integer m such that the Hamming distance H(φ(m), r˜) is minimized over all m∈[0, M). Intuitively, although r˜ may not be a valid codeword, it is decoded into the integer whose codeword is closest to r˜ under the measure of Hamming distance.

Consider now the following version of Chinese Reminder Theorem. Let p$_1$, p$_2$, . . . , p$_k$ denote positive integers which are mutually prime and M=Π$_{i=1}^k$p$_i$. Then, there exists an injective function, φ: [0, M)→[0, p$_1$)×[0, p$_2$)× . . . [0, p$_k$), defined as φ(m)=(r$_1$, r$_2$, . . . , r$_n$), for all m∈[0,M), where r$_i$=m mod p$_i$. This theorem indicates that given k pairs of integers (r$_i$, p$_i$) with p$_i$ being mutually prime, there exists a unique non-negative integer m<Π$_{i=1}^k$p$_i$, satisfying r$_i$=m mod p$_i$ for all i=1 . . . k. Indeed, m can be computed using the formula, $$m = CRT(r, p) = r_1 b_1 \frac{P}{P_1} + \ldots + r_n b_n \frac{P}{P_n}$$

where $P = \Pi_{i=1}^{k} p_i$, and $b_i$ is computed by solving a system of modular equations, $$b_i \frac{P}{P_i} = 1 (\bmod p_i), i = 1 \ldots, k,$$

using the classic Euclidean algorithm.

If the list of $p_i$ is extended to n mutually prime numbers (n>k) such that the n−k additional numbers are all larger than $p_i$ up to i=k (i.e., $p_j > p_i$ for any j=k+1 . . . n and i=1 . . . k), then an encoding function φ can be defined for non-negative integer $m < \Pi_{i=1}^{k} p_i$, as φ(m)=(m mod $p_1$, m mod $p_2$, . . . , m mod $p_n$). This encoding function already adds redundancy: because m is smaller than the product of any k numbers chosen from $p_i$, m can be computed from any k of the n pairs of ($r_i$, $p_i$), according to the Chinese Reminder Theorem. Indeed, the minimum Hamming distance of this encoding function for all $0 \le m << \Pi_{i=1}^{k} p_i$, is n−k+1. Thus, the Hamming decoding function of φ can correct up to $\lfloor (n-k)/2 \rfloor$ errors.

Thus, based on the error-correcting coding schemes described herein, consider the following encoding procedure that uses the encoding function φ(m). First, to compute $p_i$, suppose that the letter sequence of a document has been divided into N blocks, denoted as $C_1$, $C_N$, each with n letters. Consider a block $C_t = (C_1, \ldots, C_n)$, where $C_i$ indicates a letter with its original font $u_i$, whose integer concealment capacity is $s_i$ (i.e., $C_i$'s font $u_i$ has $s_i$ perturbed glyphs in the codebook). A depth-first search is performed to identify n mutually prime numbers $p_i$, i=1 . . . n, is performed such that $p_i \le s_i$ and the product of k minimal $p_i$ is maximized. At the end, $p_i$, i=1 . . . n is obtained and the product of k minimal $p_i$ denoted as $M_t$ for each block $C_t$. Note that if mutually prime numbers $p_i$ for block $C_t$ cannot be found, then the letter whose concealment capacity is smallest among all $s_i$ and includes $C_n+1$ to this block is ignored. This process is repeated until a valid set of mutually prime numbers is found.

Figure 5:
FIG. 5 is a diagram illustrating aspects of an example process to encode messages.

Next, to determine $m_t$, given the plain message represented as a bitstring M, the bits are split into a sequence of chunks, each of which is converted into an integer and assigned to a block $C_t$. Block by block, $C_t$ is assigned an integer $m_t$ with $\lfloor \log 2M_t \rfloor$ bits, which is sequentially cut from the bit string M. FIG. 5, for example, provides an illustration 500 of determining $m_t$.

Next, to perform concealment, for every block $C_t$, the codeword is computed using the CRT encoding function, and obtaining $r = (r_1, \ldots, r_n)$. Each r is then concealed in the glyph of the letter $C_i$ in the block $C_t$.

Decoding processing may be performed as follows. At decoding time, the letters from a steganographic document are recognized, their original fonts are identified, and integers from individual letters are extracted. Next, the letter sequence is divided into blocks, and the process of computing $p_i$ and $M_t$, as in the encoding step, is repeated for every block. Given a block $C_t$, the extracted integers from its letters form a code vector $\tilde{r}_t = (\tilde{r}_1, \ldots, \tilde{r}_n)$. This is referred to as a code vector because some of the $\tilde{r}_i$ may be incorrectly recognized. To decode $\tilde{r}_t$, $\tilde{m}_t = CRT(\tilde{r}_t, p_t)$ is first computed, where $p_t$ stacks all $p_i$ in the block. If $\tilde{m}_t < M_t$, then $\tilde{m}_t$ is the decoding result φ⁺($\tilde{r}_t$), because the Hamming distance H(φ($\tilde{m}_t$), $\tilde{r}$)=0. Otherwise, $\tilde{r}_t$ is decoded using the Hamming decoding function discussed herein. Concretely, since it is known that the current block can encode an integer in the range [0,$M_t$), $\tilde{r}_t$ is decoded into the integer $m_t$ by finding $m_t = \varphi^+(\tilde{r}) = \arg \min_{m \in [0, M_t)} H(\varphi(m), \tilde{r})$.

As discussed above, this decoding function can correct up to $\lfloor (n-k)/2 \rfloor$ incorrectly recognized glyphs in each block. Lastly, $m_t$ is converted into a bit string and $m_t$ is concatenated from all blocks sequentially to recover the plain message.

A few additional details are worth noting. First, oftentimes letters in a document can carry a bit string much longer than the given plain message. To indicate the end of the message at decoding time, a special chunk of bits (end-of-message bits) may be attached at the end of each plain message, akin to the end-of-line (newline) character used in digital text systems. Second, in practice, blocks should be relatively short (i.e., n is small). If n is large, it becomes much harder to find n mutually prime numbers that are no more than each letter's concealment capacity. In practice, n=5 and k=3 may be chosen, which allows one mistaken letter in every 5-letter block. The small n and k also allow a brute force search of $m_t$ sufficiently fast.

Figure 6:
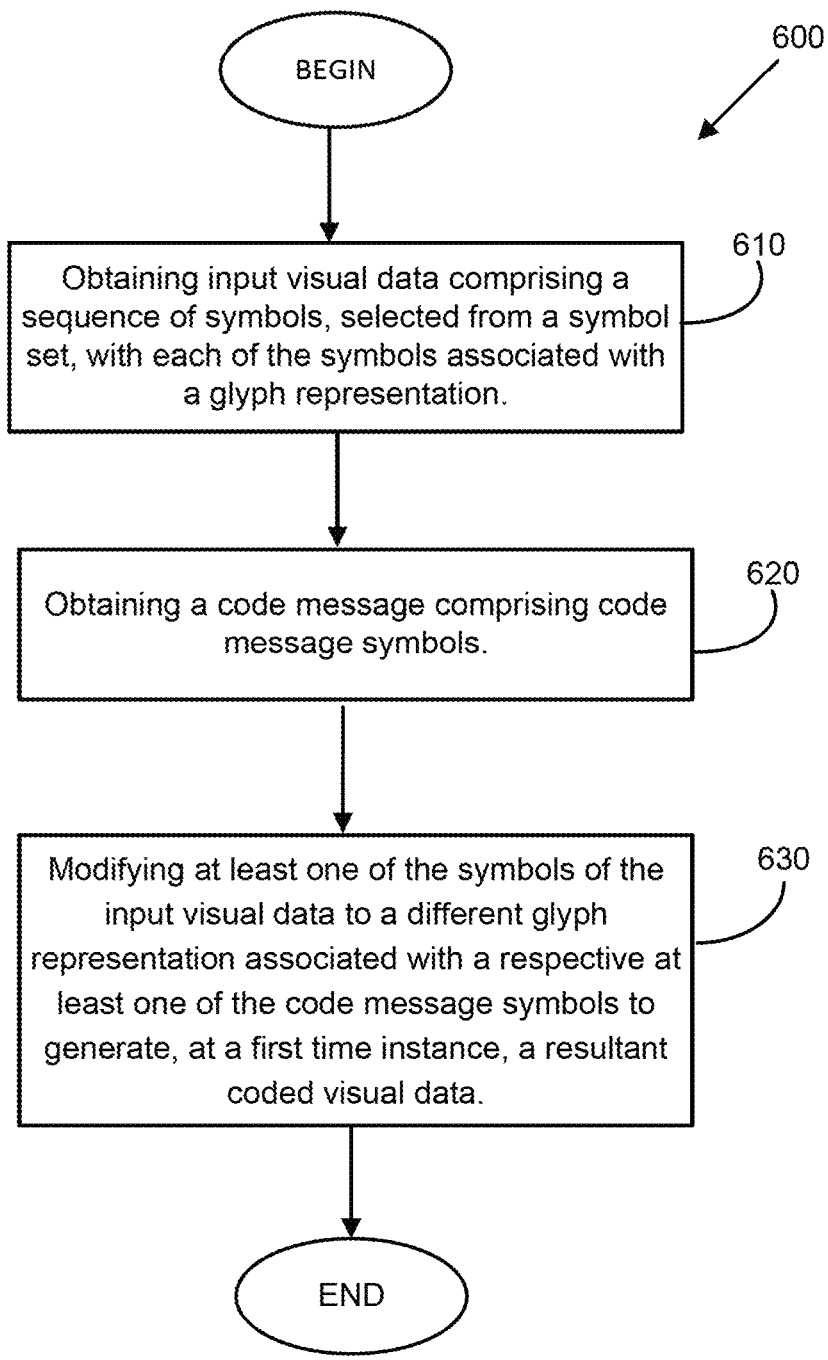
FIG. 6 is a flowchart of an example coding procedure.

With reference next to FIG. 6, a flowchart of an example coding procedure 600 is shown. The method includes obtaining 610 input visual data (e.g., an electronic document, an image obtained via a scanner or a light capture device, etc.) comprising a sequence of symbols (e.g., letters), selected from a symbol set, with each of the symbols associated with a glyph representation. The procedure 600 further includes 620 obtaining a code message comprising code message symbols. For example, in some embodiments, the code message may include a sequence of integers representative of a plain text message encoded into the sequence of integers.

The procedure 600 additionally includes modifying 630 at least one of the symbols of the input visual data to a different glyph representation associated with a respective at least one of the code message symbols to generate, at a first time instance, a resultant coded visual data. In some embodiments, modifying the at least one of the symbols may include modifying the at least one of the symbols with the different glyph representation associated with the respective at least one of the code message symbols according to a codebook comprising, for each available symbol from the symbol set, a corresponding set of glyphs associated with respective ones of available code message symbols. In such embodiments, the method may further include determining a font associated with the sequence of symbols, and selecting the codebook from a plurality of codebooks based on the determined font. Such a codebook may define a set of error correcting codes, an example of which may include error correcting codes based on the Chinese Reminder Theorem (CRT).

In some implementations, the method may further include communicating, at a second time instance subsequent to the first time instance, the generated resultant coded visual data to a remote device. The communicated generated resultant coded visual data may be decoded at the remote device according to a decoding process that includes computing, for each of the modified at least one of the symbols with the different glyph representation, distance metrics between the at least one of the symbols with the different glyph representation and each glyph in the corresponding set of glyphs in the codebook, and determining, based on the computed distance metrics, the respective code message symbol corresponding to the each of modified at least one of the symbols with the different glyph representation. The decoding process at the remote device may further include extracting from the communicated generated resultant coded visual data the each of the modified at least one of the symbols with the different glyph representation, and aligning the extracted each of the modified at least one of the symbols with the different glyph representation with symbols in the codebook, the aligning being based on outlines of the extracted each of the modified at least one of the symbols and of the symbols in the codebook. Determining, based on the computed distance metrics, the code message symbol may include selecting a decoded glyph associated with a minimum distance metrics between the each of modified at least one of the symbols and possible decoded glyph candidates for the each of modified at least one of the symbols.

Performing the various operations described herein may be facilitated by a controller system (e.g., a processor-based controller system). Particularly, at least some of the various devices/systems described herein, including a coding device (e.g., to generate a coded/concealed message based on procedures and implementations described herein), a receiving device (to decode the concealed message based on procedures and implementations described herein), a remote server or device that performs at least some of the operations described herein (such as those described in relation to FIG. 6), etc., may be implemented, at least in part, using one or more processor-based devices.

Figure 7:
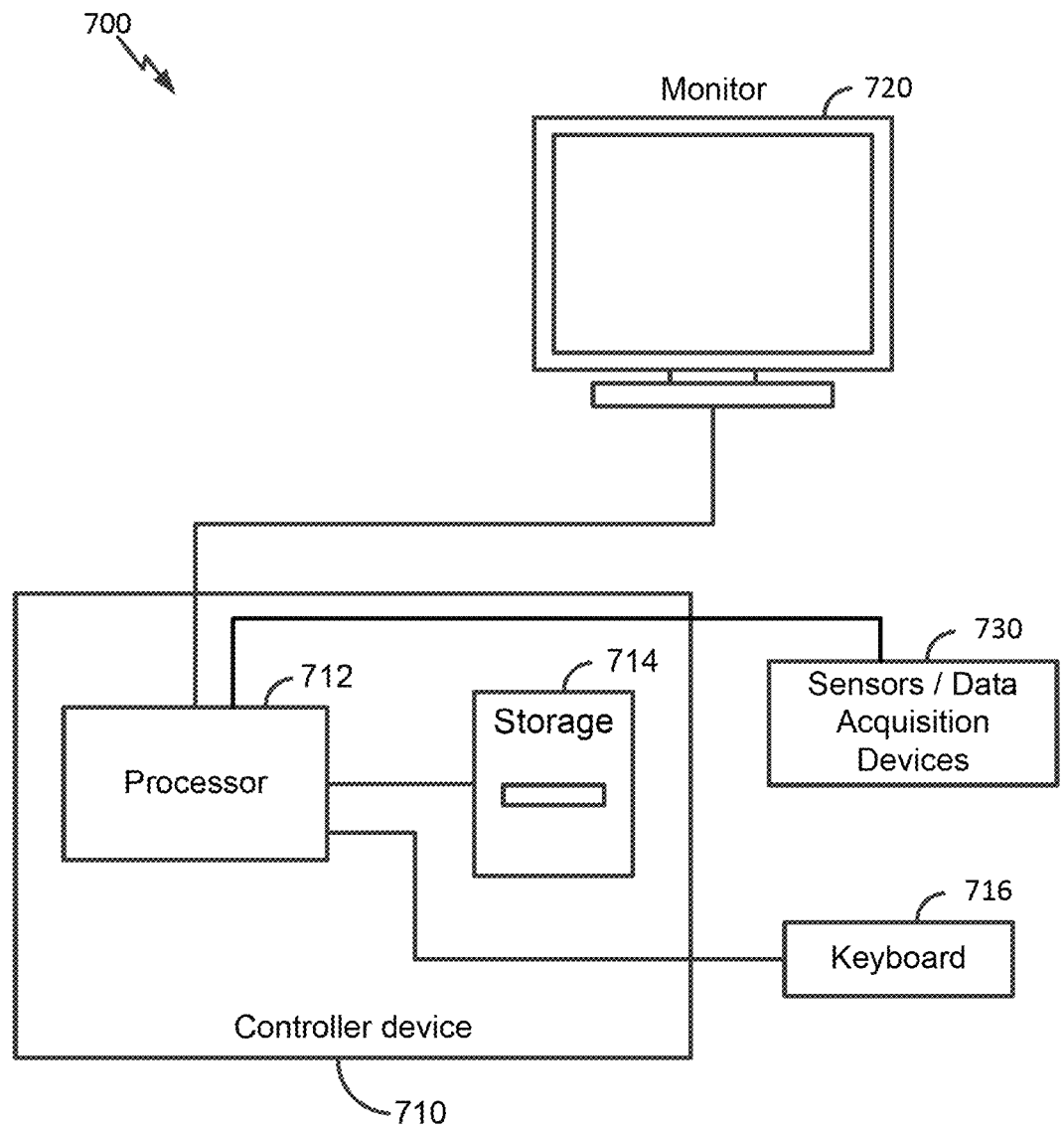
FIG. 7 is a schematic diagram of a computing system.

Thus, with reference to FIG. 7, a schematic diagram of a computing system 700 is shown. The computing system 700 includes a processor-based device (also referred to as a controller device) 710 such as a personal computer, a specialized computing device, a mobile device (e.g., a smartphone) and so forth, that typically includes a central processor unit 712, or some other type of controller. In addition to the CPU 712, the system includes main memory, cache memory and bus interface circuits (not shown in FIG. 7). The processor-based device 710 may include a mass storage element 714, such as a hard drive (realize as magnetic discs, solid state (semiconductor) memory devices), flash drive associated with the computer system, etc. The computing system 700 may further include a keyboard 716, or keypad, or some other user input interface, and a monitor 720, e.g., an LCD (liquid crystal display) monitor, that may be placed where a user can access them. The computing system 700 may also include one or more sensors or data acquisition devices 730 to obtain data (e.g., carrier source data, such as data representative of a text-based document) that is modulated, or otherwise manipulated, to encode data thereto. Such sensors or data acquisition devices may include, for example, an image-capture device (e.g., a digital camera) to obtain image data corresponding to a document, a scanner to generate a scanned electronic copy of a document, a wireless or wired transceiver to receive electronic messages representative of the carrier source data, inertial sensors, etc.

The processor-based device 710 is configured to facilitate, for example, the implementation of digital steganographic coding and decoding procedures. The storage device 714 may thus include a computer program product that when executed on the processor-based device 710 causes the processor-based device to perform operations to facilitate the implementation of procedures and operations described herein. The processor-based device may further include peripheral devices to enable input/output functionality. Such peripheral devices may include, for example, a CD-ROM drive and/or flash drive (e.g., a removable flash drive), or a network connection (e.g., implemented using a USB port and/or a wireless transceiver), for downloading related content to the connected system. Such peripheral devices may also be used for downloading software containing computer instructions to enable general operation of the respective system/device. Alternatively or additionally, in some embodiments, special purpose logic circuitry, e.g., an FPGA (field programmable gate array), an ASIC (application-specific integrated circuit), a DSP processor, a GPU, etc., may be used in the implementation of the system 700. Other modules that may be included with the processor-based device 710 are speakers, a sound card, a pointing device, e.g., a mouse or a trackball, by which the user can provide input to the computing system 700. The processor-based device 710 may include an operating system, e.g., Windows XP® Microsoft Corporation operating system, Ubuntu operating system, etc.

Computer programs (also known as programs, software, software applications or code) include machine instructions for a programmable processor, and may be implemented in a high-level procedural and/or object-oriented programming language, and/or in assembly/machine language. As used herein, the term "machine-readable medium" refers to any non-transitory computer program product, apparatus and/or device (e.g., magnetic discs, optical disks, memory, Programmable Logic Devices (PLDs)) used to provide machine instructions and/or data to a programmable processor, including a non-transitory machine-readable medium that receives machine instructions as a machine-readable signal.

In some embodiments, any suitable computer readable media can be used for storing instructions for performing the processes/operations/procedures described herein. For example, in some embodiments computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory), electrically programmable read only memory (EPROM), electrically erasable programmable read only Memory (EEPROM), etc.), any suitable media that is not fleeting or not devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

As noted, example font-based steganography systems implementing one or more of the procedures described herein, can be used to implement different applications. Several such example applications are discussed below. A first example application is for a format-independent metadata. Many digital productions carry metadata that provide additional information, resources, and digital identifications. One such well-known metadata is the metadata embedded in photographs, providing information such as capture date, exposure time, focal length, camera's GPS location, and copyright information. PDF files can also contain metadata. In fact, metadata has been widely used by numerous tools to edit and organize digital files. Currently, the storage of metadata is ad hoc, depending on a specific file format. For instance, a JPEG image stores metadata in its EXIF header, while an Adobe PDF stores its metadata in XML format with Adobe's XMP framework. Consequently, metadata is lost whenever one converts an image from JPEG to PNG format, or rasterizes a vector graphic image into a pixel image. Although it is possible to develop a careful converter that painstakingly preserves the metadata across all file formats, the metadata is still lost whenever the image or document is printed on paper.

The techniques described herein (including the FontCode implementation) can serve as a means to host text document metadata. The metadata storage in the present techniques is format-independent, because format conversion and rasterization of text documents, as well as printing them on paper, all preserve the glyphs of letters. Given a steganographic document, one can freely convert it to a different file format, or rasterize it into a pixel image (as long as the image is not severely down-sampled), or print it on a piece of paper. The metadata is retained throughout.

Another example application is that of imperceptible optical codes. The implementations described herein can be used as optical barcodes embedded in a text document, akin to QR codes. Barcodes have numerous applications in advertising, sales, inventory tracking, robotic guidance, augmented reality, and so forth. Similar to QR codes (which embed certain level of redundancy to correct decoding error), the implementations described herein also support error-correction decoding. However, most existing barcodes require to print black-and-white blocks and bars, which can be visually distracting and aesthetically imperfect. The techniques described herein, in contrast, allows not only an optical code but an unobtrusive optical code. It only introduces subtle changes to the text appearance, and, meanwhile, the retrieval process is sufficiently fast to provide point-and-shoot kind of message decoding. It can be particularly suitable for using as an invisible replacement of QR codes in an artistic work such as a poster or flyer design.

A further example application is that of encrypted message concealment. The techniques described herein can further allow encrypted message concealment, even if the entire concealment and extraction processes are made public. Recall that when concealing an integer i in a letter of font u', u' is replaced with a glyph chosen from a list of perturbed glyphs in the codebook. Let $L_i=\{u_0, \ldots, u_{Ni-1}\}$ denote this list. Even though the perturbed glyphs for every character with a particular font are precomputed and stored, the order of the glyphs in each list $L_i$ can be arbitrarily user-specified. The particular orders of all $L_i$ together can serve as an encryption key. For example, when Alice and Bob communicate through the steganographic document described herein, they use a publicly available codebook, but may agree on a private key, which specifies the glyph permutation of each list $L_i$. If an original list $\{u_0, u_1, u_2, \ldots\}$ of a letter is permuted into $\{u_{p0}, u_{p1}, u_{p2}, \ldots\}$ by the key, then Alice uses the glyph $u_{pi}$ rather than $u_i$ to conceal an integer i in the letter, and Bob deciphers the message using the same permuted codebook. For a codebook that we precomputed for the font Times New Roman, if one only considers lowercase English alphabet, there exist $1.39 \times 10^{252}$ different keys (which amount to a 837-bit key); if one also includes uppercase English alphabet, there exist $5.73 \times 10^{442}$ keys (which amount to a 1470-bit key). Thus, without resorting to any existing cryptographic algorithm, the implementations described herein already offers a basic encryption scheme.

Yet a further example application is that of text document signature. Leveraging existing cryptographic techniques, the implementations described herein (including FontCode can be augmented to propose a new digital signature technique, one that can authenticate the source of a text document and guarantee its integrity (thereby protecting from tampering). This technique has two variations. In a first scheme, when Alice creates a digital text document, she maps the document content (e.g., including letters, digits, and punctuation) into a bit string through a cryptographic hash function such as the MD5 and SHA. This bit string is referred to as the document's hash string. Alice then chooses a private key to permute the codebook, and uses the permuted codebook to conceal the hash string into her text document. When Bob tries to tamper this document, any change leads to a different hash string. Without knowing Alice's private key, he cannot conceal the new hash string in the document, and thus cannot tamper the document successfully. Later, Alice can check the integrity of her document, by extracting the concealed hash string and comparing it against the hash string of the current document.

The above scheme allows only Alice to check the integrity of her document, as only she knows her private key. In a second scheme, by combining with asymmetric cryptography such as the RSA algorithm, other parties are allowed to check the integrity of a document but not to tamper it. Now, the codebook is not permuted and is made public. After Alice generates the hash string of her document, she encrypts the hash string using her private key by an asymmetric cryptosystem, and obtains an encrypted string. Then, she conceals the encrypted string in her document using the implementations described herein, while making her public key available to everyone. In this situation, Bob cannot tamper the document, as he does not have Alice's private key to encrypt the hash string of an altered document. But everyone in the world can extract the encrypted string using the methods/procedures described herein, and decipher the hash string using Alice's public key. If the deciphered hash string matches the hash string of the current document, it proves that: (i) the document is indeed sourced from Alice, and (ii) the document has not been modified by others.

Thus, described herein are implementations relating to a new steganographic technique that can be used, for example, with text-based documents. To hide a user-specified message, the implementations assign each text letter an integer and conceal the integer by perturbing the glyph of each letter according to a precomputed codebook. The implementations are able to correct a certain number of errors in the decoding stage, through a proposed new error-correction coding scheme built on two process components: the Chinese Remainder coding, and the maximum likelihood decoding. The coding/decoding implementations may be used in various applications such as text document metadata storage, unobtrusive optical codes on text, a symmetric-key encryption scheme, and format-independent digital signatures.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as such variations are appropriate in the context of the systems, devices, circuits, methods, and other implementations described herein.

As used herein, including in the claims, "or" as used in a list of items prefaced by "at least one of" or "one or more of"

indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Also, as used herein, unless otherwise stated, a statement that a function or operation is "based on" an item or condition means that the function or operation is based on the stated item or condition and may be based on one or more items and/or conditions in addition to the stated item or condition.

Although particular embodiments have been disclosed herein in detail, this has been done by way of example for purposes of illustration only, and is not intended to be limit the scope of the invention, which is defined by the scope of the appended claims. Features of the disclosed embodiments can be combined, rearranged, etc., within the scope of the invention to produce more embodiments. Some other aspects, advantages, and modifications are considered to be within the scope of the claims provided below. The claims presented are representative of at least some of the embodiments and features disclosed herein. Other unclaimed embodiments and features are also contemplated.

What is claimed is:

1. A method comprising:
   obtaining input visual data comprising a sequence of symbols, selected from a symbol set, with each of the symbols associated with a glyph representation;
   obtaining a code message comprising code message symbols;
   modifying at least one of the symbols of the input visual data to a different glyph representation associated with a respective at least one of the code message symbols to generate, at a first time instance, a resultant coded visual data, wherein modifying the at least one of the symbols comprises modifying the at least one of the symbols with the different glyph representation associated with the respective at least one of the code message symbols according to a codebook comprising, for each available symbol from the symbol set, a corresponding set of glyphs associated with respective ones of available code message symbols; and
   communicating, at a second time instance subsequent to the first time instance, the generated resultant coded visual data to a remote device, wherein the communicated generated resultant coded visual data is decoded at the remote device according to a decoding process that includes:
      computing, for each of the modified at least one of the symbols with the different glyph representation, distance metrics between the at least one of the symbols with the different glyph representation and each glyph in the corresponding set of glyphs in the codebook; and
      determining, based on the computed distance metrics, the respective code message symbol corresponding to the each of modified at least one of the symbols with the different glyph representation.

2. The method of claim 1, further comprising:
   determining a font associated with the sequence of symbols; and
   selecting the codebook from a plurality of codebooks based on the determined font.

3. The method of claim 1, wherein the codebook defines a set of error correcting codes.

4. The method of claim 3, wherein the set of error correcting codes comprise codes based on the Chinese Reminder Theorem (CRT).

5. The method of claim 1, wherein the decoding process at the remote device further includes:
   extracting from the communicated generated resultant coded visual data the each of the modified at least one of the symbols with the different glyph representation; and
   aligning the extracted each of the modified at least one of the symbols with the different glyph representation with symbols in the codebook, the aligning being based on outlines of the extracted each of the modified at least one of the symbols and of the symbols in the codebook.

6. The method of claim 1, wherein determining, based on the computed distance metrics, the code message symbol, comprises:
   selecting a decoded glyph associated with a minimum distance metrics between the each of modified at least one of the symbols and possible decoded glyph candidates for the each of modified at least one of the symbols.

7. The method of claim 1, wherein the code message comprises a sequence of integers representative of a plain text message encoded into the sequence of integers.

8. A system comprising:
   at least one processor; and
   storage media comprising computer instructions that, when executed on the at least one processor, cause operations comprising:
      obtaining input visual data comprising a sequence of symbols, selected from a symbol set, with each of the symbols associated with a glyph representation;
      obtaining a code message comprising code message symbols; and
      modifying at least one of the symbols of the input visual data to a different glyph representation associated with a respective at least one of the code message symbols to generate, at a first time instance, a resultant coded visual data, wherein modifying the at least one of the symbols comprises modifying the at least one of the symbols with the different glyph representation associated with the respective at least one of the code message symbols according to a codebook comprising, for each available symbol from the symbol set, a corresponding set of glyphs associated with respective ones of available code message symbols; and
   communicating, at a second time instance subsequent to the first time instance, the generated resultant coded visual data to a remote device, wherein the communicated generated resultant coded visual data is decoded at the remote device according to a decoding process that includes:
      computing, for each of the modified at least one of the symbols with the different glyph representation, distance metrics between the at least one of the symbols with the different glyph representation and each glyph in the corresponding set of glyphs in the codebook; and
      determining, based on the computed distance metrics, the respective code message symbol corresponding to the each of modified at least one of the symbols with the different glyph representation.

9. The system of claim 8, wherein the operations further comprise:
   determining a font associated with the sequence of symbols; and
   selecting the codebook from a plurality of codebooks based on the determined font.

10. The system of claim 8, wherein the codebook defines a set of error correcting codes.

11. The system of claim 10, wherein the set of error correcting codes comprise codes based on the Chinese Reminder Theorem (CRT).

12. The system of claim 8, wherein the decoding process at the remote device further includes:
    extracting from the communicated generated resultant coded visual data the each of the modified at least one of the symbols with the different glyph representation; and
    aligning the extracted each of the modified at least one of the symbols with the different glyph representation with symbols in the codebook, the aligning being based on outlines of the extracted each of the modified at least one of the symbols and of the symbols in the codebook.

13. The system of claim 8, wherein determining, based on the computed distance metrics, the code message symbol, comprises:
    selecting a decoded glyph associated with a minimum distance metrics between the each of modified at least one of the symbols and possible decoded glyph candidates for the each of modified at least one of the symbols.

14. The system of claim 8, wherein the code message comprises a sequence of integers representative of a plain text message encoded into the sequence of integers.

15. Non-transitory computer readable media comprising computer instructions executable on a processor-based device to:
    obtain input visual data comprising a sequence of symbols, selected from a symbol set, with each of the symbols associated with a glyph representation;
    obtain a code message comprising code message symbols;
    modify at least one of the symbols of the input visual data to a different glyph representation associated with a respective at least one of the code message symbols to generate, at a first time instance, a resultant coded visual data, wherein the instructions to modify the at least one of the symbols include one or more instructions to modify the at least one of the symbols with the different glyph representation associated with the respective at least one of the code message symbols according to a codebook comprising, for each available symbol from the symbol set, a corresponding set of glyphs associated with respective ones of available code message symbols; and
    communicate, at a second time instance subsequent to the first time instance, the generated resultant coded visual data to a remote device, wherein the communicated generated resultant coded visual data is decoded at the remote device according to a decoding process that includes:
        computing, for each of the modified at least one of the symbols with the different glyph representation, distance metrics between the at least one of the symbols with the different glyph representation and each glyph in the corresponding set of glyphs in the codebook; and
        determining, based on the computed distance metrics, the respective code message symbol corresponding to the each of modified at least one of the symbols with the different glyph representation.

16. The computer readable media of claim 15, further comprising one or more instructions to:
    determine a font associated with the sequence of symbols; and
    select the codebook from a plurality of codebooks based on the determined font.

* * * * *